US011371160B2

United States Patent
Kawasaki

(10) Patent No.: US 11,371,160 B2
(45) Date of Patent: Jun. 28, 2022

(54) SEED CRYSTAL HOLDER FOR PULLING UP SINGLE CRYSTAL AND METHOD OF MANUFACTURING SILICON SINGLE CRYSTAL USING THE SAME

(71) Applicant: SUMCO CORPORATION, Tokyo (JP)

(72) Inventor: Eiichi Kawasaki, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 17/039,060

(22) Filed: Sep. 30, 2020

(65) Prior Publication Data

US 2021/0010156 A1 Jan. 14, 2021

Related U.S. Application Data

(60) Continuation of application No. 16/502,383, filed on Jul. 3, 2019, now Pat. No. 10,822,717, which is a (Continued)

(30) Foreign Application Priority Data

Apr. 9, 2015 (JP) .................................. 2015-079864

(51) Int. Cl.
*C30B 15/32* (2006.01)
*C30B 29/06* (2006.01)
(Continued)

(52) U.S. Cl.
CPC .............. *C30B 15/32* (2013.01); *B32B 18/00* (2013.01); *C04B 35/83* (2013.01); *C30B 15/007* (2013.01);
(Continued)

(58) Field of Classification Search
CPC ............ B32B 18/00; C04B 2235/5268; C04B 2237/385; C04B 2237/765;
(Continued)

(56) References Cited

U.S. PATENT DOCUMENTS 6,139,632 A * 10/2000 Izumi ....................... C30B 15/32
117/200
2012/0103251 A1 * 5/2012 Sakamoto ............... C30B 29/36
117/208

FOREIGN PATENT DOCUMENTS

JP 09295889 11/1997
JP 09295889 A * 11/1997
(Continued)

OTHER PUBLICATIONS

Search Report issued in International Bureau of WIPO Patent Application No. PCT/JP2016/054653, dated Mar. 29, 2016.

*Primary Examiner* — Hua Qi
(74) *Attorney, Agent, or Firm* — Greenblum & Bernstein, P.L.C.

(57) ABSTRACT

A seed crystal holder for pulling up a single crystal is made of a carbon fiber-reinforced carbon composite material, and has a substantially cylindrical shape with a hollow space having a shape matching an outer shape of a substantially rod-shaped seed crystal. A direction of carbon fibers at a part in contact with at least an outer peripheral surface of the seed crystal has isotropy as viewed from a central axis of the hollow space.

11 Claims, 9 Drawing Sheets

Related U.S. Application Data division of application No. 15/564,080, filed as application No. PCT/JP2016/054653 on Feb. 18, 2016, now Pat. No. 10,385,473.

(51) Int. Cl.
  *B32B 18/00* (2006.01)
  *C04B 35/83* (2006.01)
  *C30B 15/00* (2006.01)

(52) U.S. Cl.
  CPC ...... *C30B 29/06* (2013.01); *C04B 2235/5268* (2013.01); *C04B 2237/385* (2013.01); *C04B 2237/765* (2013.01); *C04B 2237/84* (2013.01)

(58) Field of Classification Search
  CPC ... C04B 2237/84; C04B 35/83; C30B 15/007; C30B 15/32; C30B 29/06
  See application file for complete search history.

(56) References Cited

FOREIGN PATENT DOCUMENTS

| | | | |
|---|---|---|---|
| JP | H09-295889 A | 11/1997 | |
| JP | H09-315883 A | 12/1997 | |
| JP | H11-116378 A | 4/1999 | |
| JP | H11-292689 A | 10/1999 | |

\* cited by examiner

SEED CRYSTAL HOLDER FOR PULLING UP SINGLE CRYSTAL AND METHOD OF MANUFACTURING SILICON SINGLE CRYSTAL USING THE SAME

CROSS-REFERENCE TO RELATED APPLICATION

This application is a Divisional Application of U.S. patent application Ser. No. 16/502,383, filed Jul. 3, 2019, which is a Divisional Application of U.S. patent application Ser. No. 15/564,080, filed Oct. 3, 2017, now U.S. Pat. No. 10,385,473, issued Aug. 20, 2019, which is a U.S. National Stage Entry of International Patent Application No. PCT/JP2016/054653, filed Feb. 18, 2016, which claims the benefit of priority of Japanese Patent Application No. 2015-079864, filed Apr. 9, 2015. The disclosure of each of the above-identified documents, including the specification, drawings, and claims, is incorporated herein by reference in its entirety.

TECHNICAL FIELD

The present invention relates to a seed crystal holder for pulling-up a single crystal, and more particularly to a seed crystal holder for pulling-up a single crystal used in manufacturing a silicon single crystal by the Czochralski method (hereinafter, referred to as CZ method). The present invention also relates to a method of manufacturing a silicon single crystal using such a seed crystal holder.

BACKGROUND ART

Most of the silicon single crystals as materials for silicon wafers are manufactured by the CZ method. In the CZ method, a seed crystal is dipped into a silicon melt contained in a quartz crucible and slowly pulled up while rotating the seed crystal and quartz crucible to grow a silicon single crystal having the same crystal orientation as that of the seed crystal at a lower end of the seed crystal.

Recently, along with an increase in the size of the silicon single crystal being pulled up, the strength of a graphite seed crystal holder (seed chuck) for holding a seed crystal has become a problem. When the strength of the seed crystal holder is insufficient, the holder itself may not withstand the heavyweight of the silicon single crystal and thus may finally break, causing the silicon single crystal to fall off.

To increase the strength of the seed crystal holder, Patent Document 1 proposes a carbon fiber cloth reinforced graphite seed crystal holder. This seed crystal holder has a structure in which carbon fibers are wound in the peripheral direction at least at its lower peripheral portion and arranged in the vertical direction at the remaining portion thereof. Further, Patent Documents 2 and 3 propose a method of holding a seed crystal while keeping it unbroken by interposing a cushioning material between the tapered portion of the seed crystal and the surface of the seed crystal holder. Further, Patent Document 4 discloses a method of suppressing SiC reaction by forming a coating of pyrolytic carbon on the surface of the seed crystal holder formed of a carbon fiber-reinforced composite material to improve durability of the seed crystal holder.

CITATION LIST

Patent Document

[Patent Document 1] Japanese Patent Application Laid-Open No. 1109-315883

[Patent Document 2] Japanese Patent Application Laid-Open No. 1111-116378

[Patent Document 3] Japanese Patent Application Laid-Open No. H11-292689

[Patent Document 4] Japanese Patent Application Laid-Open No. 1109-295889

SUMMARY OF THE INVENTION

Problems to Be Solved By the Invention

However, in the conventional seed crystal holder described in Patent Document 1, the direction of the carbon fibers in the horizontal cross section is straight in one direction. Thus, as illustrated in FIG. 9, at portions A and C where the inner peripheral surface $S_1$ of a seed crystal holder 8 is parallel to the direction of carbon fibers 8$f$, an inner peripheral surface $S_1$ is likely to be deform, and compression stress to be applied to the outer peripheral surface of the seed crystal is small; while at portions B and D where the inner peripheral surface $S_1$ of the seed crystal holder 8 is substantially perpendicular to the direction of the carbon fibers 8$f$, an inner peripheral surface $S_1$ is unlikely to deform, and compression stress to be applied to the outer peripheral surface of the seed crystal is large. Thus, when the stress that the outer peripheral surface of the seed crystal receives from the inner peripheral surface of the seed crystal holder differs between the part parallel to the fiber direction (X-direction) and the part perpendicular to the fiber direction (Y-direction), the stress may concentrate on a specific part of the seed crystal to break the seed crystal. Further, the method described in Patent Documents 2 and 3 must separately prepare the cushioning material, so that not only extra mounting work is required, but also effects brought about by the cushioning material are insufficient.

The breakage of the seed crystal due to the stress concentration is a new problem emerged in the pulling-up of the silicon single crystal having a diameter of 450 mm. In pulling-up of the silicon single crystal having a diameter of 300 mm whose crystal weight is not as heavy as that, the seed crystal is hardly broken at a part contacting the seed crystal holder. However, in the pulling-up of the silicon single crystal having a diameter of 450 mm, the crystal weight sometimes exceeds 1000 kg, which is so heavy as highlighting the above problem, and hence, early resolution of the problem is desired.

Means for Solving the Problems

It is therefore an object of the present invention to provide a seed crystal holder for pulling up a single crystal capable of preventing stress concentration on a specific part of the seed crystal and enhancing the strength thereof in the vertical direction. Another object of the present invention is to provide a safe and highly reliable silicon single crystal manufacturing method using the seed crystal holder.

To solve the above problems, a seed crystal holder for pulling up a single crystal according to a first aspect of the present invention is made of a carbon fiber-reinforced carbon composite material and has a substantially cylindrical shape with a hollow space having a shape matching an outer shape of a substantially rod-shaped seed crystal, wherein at least the direction of carbon fibers at a part contacting at least an outer peripheral surface of the seed crystal has isotropy as viewed from the center axis of the hollow space.

According to the present invention, it is possible to prevent stress concentration on a specific part of the outer peripheral surface of the seed crystal that contacts the seed crystal holder.

In the present invention, the direction of the carbon fibers at the part contacting the outer peripheral surface of the seed crystal has preferably a circumferential direction component. With this configuration, the entire inner peripheral surface of the hollow space of the seed crystal holder is parallel to the direction of the carbon fibers in a horizontal cross section, so that the fiber structure of the carbon fibers can be made isotropic.

In the present invention, the direction of the carbon fibers at the part contacting the outer peripheral surface of the seed crystal preferably further has a component parallel to the center axis. With this configuration, when, for example, the carbon fibers are obliquely wound in a crisscrossed form, the carbon fibers include a fiber component parallel to the axial direction, so that the tensile strength of the seed crystal holder in the axial direction can be enhanced.

In the present invention, it is preferable that the seed crystal has a tapered section having a gradually reduced diameter, that the hollow space has an inner peripheral surface brought into surface contact with the tapered section, and that the direction of the carbon fibers at a part constituting the inner peripheral surface has isotropy as viewed from the center axis of the hollow space. When the direction of the carbon fibers included in a part of the inner peripheral surface of the hollow space that is brought into surface contact with the tapered surface of the seed crystal has isotropy as viewed from the center axis of the hollow space as described above, it is possible to prevent stress concentration on a specific part of the outer peripheral surface of the seed crystal that contacts the seed crystal holder.

In the present invention, the direction of the carbon fibers constituting the entire seed crystal holder preferably has isotropy as viewed from the center axis of the hollow space. This configuration, which is simple in structure, can facilitate the manufacture of the seed crystal holder.

In the present invention, the direction of the carbon fibers at a part other than that contacts the outer peripheral surface of the seed crystal preferably has anisotropy as viewed from the center axis of the hollow space. With this configuration, it is possible to enhance tensile strength in the axial direction and thus to improve mechanical strength of the seed crystal holder.

A seed crystal holder for pulling up a single crystal according to a second aspect of the present invention is made of a carbon fiber-reinforced carbon composite material and has a substantially cylindrical shape with a hollow space having a shape matching an outer shape of a substantially rod-shaped seed crystal, the seed crystal holder includes a core part in which the direction of carbon fibers has isotropy as viewed from the center axis of the hollow space and a clad part in which the direction of the carbon fibers has anisotropy as viewed from the center axis of the hollow space, wherein the core part is provided at least at a part contacting an outer peripheral surface of the seed crystal.

According to the present invention, it is possible to prevent stress concentration on a specific part of the outer peripheral surface of the seed crystal that contacts the seed crystal holder.

In the present invention, the direction of the carbon fibers constituting the core part preferably has a circumferential direction component. With this configuration, the entire inner peripheral surface of the hollow space of the seed crystal holder is parallel to the direction of the carbon fibers in a horizontal cross section, so that the fiber structure of the carbon fibers can be made isotropic.

In the present invention, the direction of the carbon fibers constituting the core part preferably has a component parallel to the center axis. With this configuration, the carbon fibers include a fiber component parallel to the axial direction, so that tensile strength of the seed crystal holder in the axial direction can be enhanced.

The seed crystal holder according to the present invention preferably includes a cylindrical upper section having a first hole diameter, a cylindrical intermediate section positioned below the cylindrical upper section and being gradually reduced in diameter from the first hole diameter to a second hole diameter, and a cylindrical lower section positioned below the cylindrical intermediate section and having the second hole diameter. The core part is preferably provided at least in an inner peripheral side region of the cylindrical intermediate section. The clad part is preferably provided in a region other than the formation region of the core part. When the core part is provided at least in the inner peripheral side region of the cylindrical intermediate section as described above, it is possible to prevent stress concentration on a specific part of the outer peripheral surface of the seed crystal that contacts the seed crystal holder.

In the present invention, it is preferable that the core part is provided in the cylindrical intermediate section and cylindrical lower section, and the clad part is provided in the cylindrical upper section. With this configuration, separately molded core part and clad part can be integrated with each other through carbonization or can mechanically be connected using a pin or a bolt. This facilitates the manufacture of the seed crystal holder and can lead to a reduction in manufacturing cost and improvement in processing accuracy.

In the present invention, it is preferable that the core part is provided in the inner peripheral side regions of the respective cylindrical upper section, cylindrical intermediate section, and cylindrical lower section, and the clad part is provided in the outer peripheral side regions of the respective cylindrical upper section, cylindrical intermediate section, and cylindrical lower section. With this configuration, the clad part can be formed by winding carbon fiber cloth around a molded product of the cylindrical core part, thereby facilitating the processing. Thus, it is possible to achieve a reduction in manufacturing cost and improvement in processing accuracy.

In the present invention, the core part is preferably removable from the clad part. With this configuration, the core part and clad part can be separately manufactured, making a manufacturing process very simple. Further, the core part and clad part can be separately replaced with new ones, thereby achieving a reduction in component cost.

A seed crystal holder for pulling up a single crystal according to a third aspect of the present invention is made of a carbon fiber-reinforced carbon composite material and has a substantially cylindrical shape with a hollow space having a shape matching an outer shape of a substantially rod-shaped seed crystal, the seed crystal holder includes a core part in which the direction of carbon fibers has isotropy as viewed from the center axis of the hollow space and a clad part in which the direction of the carbon fibers has isotropy as viewed from the center axis of the hollow space, wherein the direction of the carbon fibers constituting the core part has a circumferential direction component, the direction of the carbon fibers constituting the clad part has both a circumferential direction component and a component parallel to the center axis, the core part is provided at least at a part contacting the outer peripheral surface of the seed crystal, and the clad part is provided in a region other than the formation region of the core part.

According to the present invention, it is possible to prevent stress concentration on a specific part of the outer peripheral surface of the seed crystal that contacts the seed crystal holder.

A method of manufacturing silicon single crystal according to the present invention is characterized in that it pulls up a silicon single crystal having a diameter of 450 mm or more by CZ method using the above-mentioned seed crystal holder of the present invention.

Advantages of the Invention

According to the present invention, it is possible to provide a seed crystal holder capable of preventing stress concentration on the seed crystal and enhancing strength in the vertical direction. Further, according to the present invention, it is possible to provide a safe and highly reliable silicon single crystal manufacturing method.

BRIEF DESCRIPTION OF DRAWINGS

FIGS. 1A and 1B are views each illustrating a structure of a seed crystal holder for pulling-up a single crystal according to a first embodiment of the present invention, wherein FIG. 1A is a vertical cross-sectional view, and FIG. 1B is a horizontal cross-sectional view taken along line A-A' of FIG. 1A;

FIGS. 2A and 2B are views each illustrating a structure of a seed crystal holder for pulling-up a single crystal according to a second embodiment of the present invention, wherein FIG. 2A is a vertical cross-sectional view, and FIG. 2B is a horizontal cross-sectional view taken along line A-A' of FIG. 2A;

FIGS. 3A and 3B are views each illustrating a structure of a seed crystal holder for pulling-up a single crystal according to a third embodiment of the present invention, wherein FIG. 3A is a vertical cross-sectional view, and FIG. 3B is a horizontal cross-sectional view taken along line A-A' of FIG. 3A;

FIGS. 4A and 4B are views each illustrating a structure of a seed crystal holder for pulling-up a single crystal according to a fourth embodiment of the present invention, wherein FIG. 4A is a vertical cross-sectional view, and FIG. 4B is a horizontal cross-sectional view taken along line A-A' of FIG. 4A;

FIGS. 5A and 5B are views each illustrating a structure of a seed crystal holder for pulling-up a single crystal according to a fifth embodiment of the present invention, wherein FIG. 5A is a vertical cross-sectional view, and FIG. 5B is a horizontal cross-sectional view taken along line A-A' of FIG. 5A;

FIGS. 6A and 6B are views each illustrating a structure of a seed crystal holder for pulling-up a single crystal according to a sixth embodiment of the present invention, wherein FIG. 6A is a vertical cross-sectional view, and FIG. 6B is a horizontal cross-sectional view taken along line A-A' of FIG. 6A;

FIGS. 7A and 7B are views each illustrating a structure of a seed crystal holder for pulling-up a single crystal according to a seventh embodiment of the present invention, wherein FIG. 7A is a vertical cross-sectional view, and FIG. 7B is a horizontal cross-sectional view taken along line A-A' of FIG. 7A;

DETAILED DESCRIPTION OF THE EMBODIMENTS

Preferred embodiments of the present invention will be described in detail below with reference to the accompanying drawings.

Figure 1A:
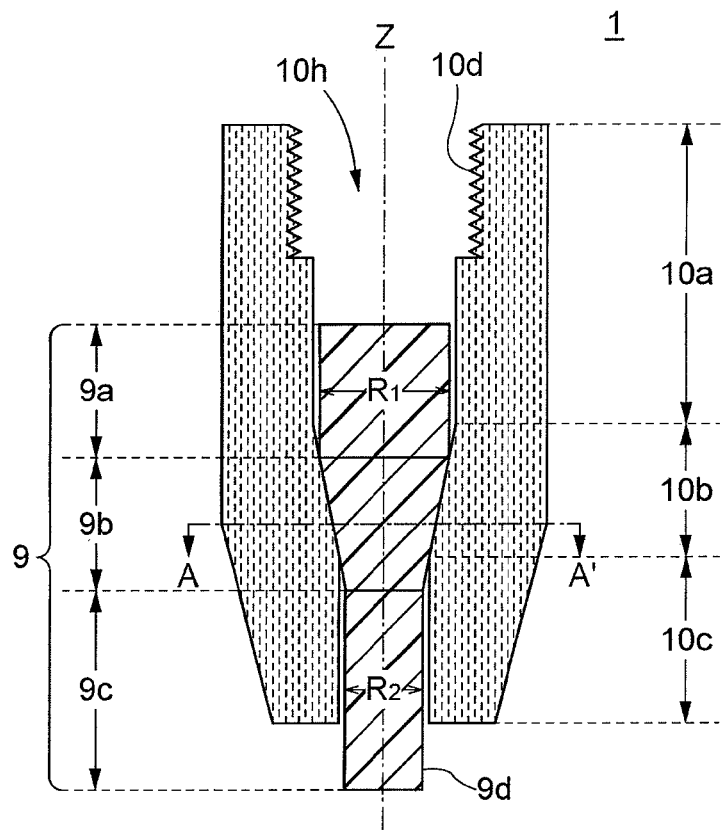
Figure 1B:
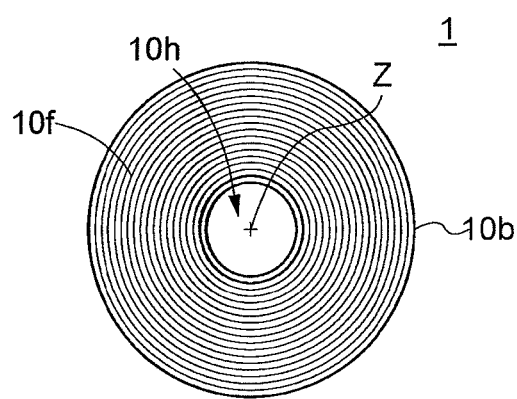

FIGS. 1A and 1B are views each illustrating a structure of a seed crystal holder for pulling-up a single crystal according to a first embodiment of the present invention. FIG. 1A is a vertical cross-sectional view, and FIG. 1B is a horizontal cross-sectional view taken along line A-A' of FIG. 1A.

As illustrated in FIGS. 1A and 1B, a seed crystal holder 1 is a substantially cylindrical member made of a carbon fiber-reinforced carbon composite material (C/C composite), and a seed crystal 9 is inserted into a hollow space $10h$ to be held. A lower end section $9d$ of the seed crystal 9 held by the seed crystal holder 1 protrudes downward from the lower end of the seed crystal holder 1, and the seed crystal 9 is pulled up while the lower end section $9d$ is dipped in a silicon melt, whereby a silicon single crystal is grown. The vertical direction of the seed crystal holder 1 is defined according to a normal use state.

The seed crystal 9 is formed into an elongated rod shape (substantially columnar shape) and has an upper section $9a$ having a relatively large diameter $R_1$, a tapered section $9b$ having a gradually reduced diameter, and a lower section $9c$ having a relatively small diameter $R_2$ ($R_2 < R_1$). The diameters of the respective upper section $9a$ and lower section $9c$ are constant. The lower section $9c$ of the seed crystal 9 has a length long enough to protrude from the lower end of the seed crystal holder 1. It is possible to safely pull up a large-diameter and large-weight silicon single crystal 9 for, e.g., 450 mm wafer by using as thick a seed crystal 9 as possible. In case of pulling-up a large-weight silicon single crystal, the effect of the present invention is remarkable because the influence of stress concentration that the seed crystal 9 receives from the seed crystal holder 1 is large.

The seed crystal holder 1 has a cylindrical upper section $10a$ having a larger hole diameter than the diameter $R_1$ of the upper section $9a$ of the seed crystal 9, a cylindrical intermediate section $10b$ having a gradually reduced hole diameter, and a cylindrical lower section $10c$ having a hole diameter smaller than the diameter $R_1$ of the upper section $9a$ of the seed crystal 9 and larger than the diameter $R_2$ of the lower section $9c$. The hollow space $10h$ has a shape matching the outer shape of the seed crystal 9 and extends in the vertical direction to penetrate the seed crystal holder 1. A thread groove $10d$ is formed in the inner peripheral surface of the seed crystal holder 1 at the upper end portion of the cylindrical upper section $10a$, and the distal end portion of a pulling-up shaft of a silicon single crystal pulling-up apparatus can be screwed to the thread groove $10d$.

The inner peripheral surface of the cylindrical intermediate section $10b$ has a tapered surface corresponding to the inclined angle of the tapered section $9b$ of the seed crystal 9. By making the taper angle of the cylindrical intermediate section $10b$ substantially the same as the taper angle of the tapered section $9b$ of the seed crystal 9, the outer peripheral surface of the seed crystal 9 can be brought into surface contact with the inner peripheral surface of the hollow space 10h of the seed crystal holder 1, thereby widening a contact range between the seed crystal 9 and the seed crystal holder 1. The larger the weight of a single crystal to be crystallized at the lower end of the seed crystal 9 is, the larger the pressure that the tapered section 9b receives from the inner peripheral surface of the seed crystal holder 1 becomes; however, by widening the surface contact range, stress to be applied to the seed crystal 9 can be widely dispersed to thereby avoid stress concentration on a specific part.

The inner peripheral tapered surface of the cylindrical intermediate section 10b is more preferably a curved surface slightly bulging inward. By thus gently curving the inner peripheral surface of the cylindrical intermediate section 10b, it is possible to surely bring the inner peripheral surface of the cylindrical intermediate section 10b contact with the tapered section 9b of the seed crystal 9 and thus to reliably support the seed crystal 9.

A carbon fiber-reinforced carbon composite material is used for the seed crystal holder 1. The carbon fiber-reinforced carbon composite material is obtained by applying carbonization (graphitization) treatment to a matrix in which carbon fibers are impregnated with resin or pitch and can improve mechanical strength while assuming the characteristics of graphite.

Figure 9:
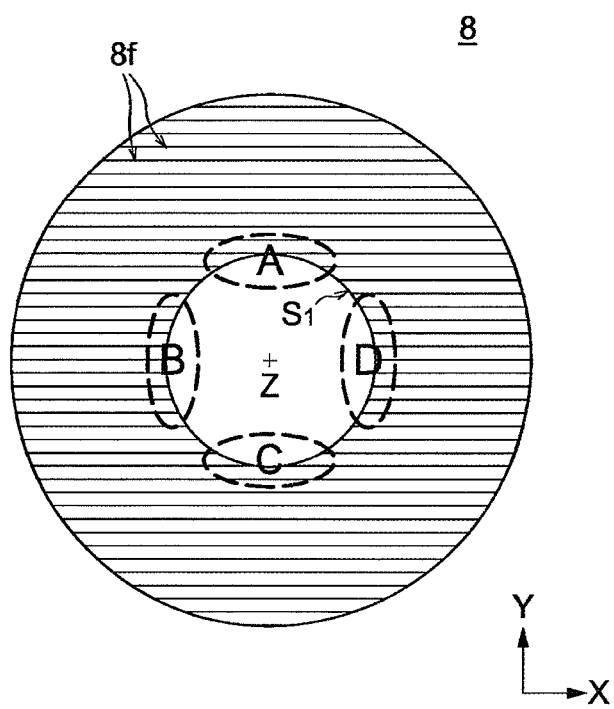

As illustrated in FIG. 1B, carbon fibers 10f of the seed crystal holder 1 is oriented in the circumferential direction in a horizontal cross section perpendicular to a center axis Z and has isotropy as viewed from the center axis Z. As illustrated in FIG. 9, when the direction of the carbon fibers in the horizontal cross section is straight in one direction, of the outer peripheral surface (tapered surface) of the seed crystal 9 contacting the inner peripheral surface of the hollow space 10h of seed crystal holder, surfaces (portions B and D) perpendicular to the fiber direction experience larger stress concentration than surfaces (portions A and C) parallel to the fiber direction do, so that the seed crystal 9 may be broken therefrom. However, the inner peripheral surface of the hollow space 10h of the seed crystal holder 1 according to the present embodiment is parallel to the direction of the carbon fibers 10f over the entire circumference thereof, so that it is possible to prevent excessive stress concentration on a specific part of the outer peripheral surface of the seed crystal 9.

The seed crystal holder 1 according to the present embodiment can be molded by a filament winding method (FW method) or a sheet winding method (SW method). In the filament winding method, a die (mandrel) having the same shape as the hollow space 10h is prepared, and a molded product is obtained by winding an array of a plurality of carbon fibers impregnated with resin or pitch around the die. In the sheet winding method, a molded product is obtained by winding carbon fiber cloth impregnated with resin or pitch around the die. Thereafter, the obtained molded product is heated at high temperatures in an inert gas atmosphere until it is carbonized (graphitized). The dipping in the resin or the like of the molded product and the carbonizing step may be repeated several times. Then, the carbonized molded product is shaped, followed by finishing such as polishing, whereby the seed crystal holder 1 is completed.

In the filament winding method, the carbon fibers are preferably wound such that the winding angle thereof with respect to a winding core axis is as small as possible. By winding the carbon fibers in this way, the number of fiber components in the lengthwise direction can be increased, and tensile strength in the axial direction can be enhanced.

Further, in the sheet winding method, it is preferable to enhance tensile strength in the axial direction by using carbon fiber cloth including a lengthwise fiber component.

As described above, the seed crystal holder 1 according the present embodiment is a cylindrical member made of a carbon fiber-reinforced carbon composite material and having a hollow space. The carbon fibers 10f extends in the circumferential direction in the horizontal cross section perpendicular to the center axis of the seed crystal holder 1 and has isotropy, thereby making it possible to prevent stress concentration from the seed crystal holder 1 to the seed crystal 9. Thus, breakage of the seed crystal 9 can be prevented.

Figure 2A:
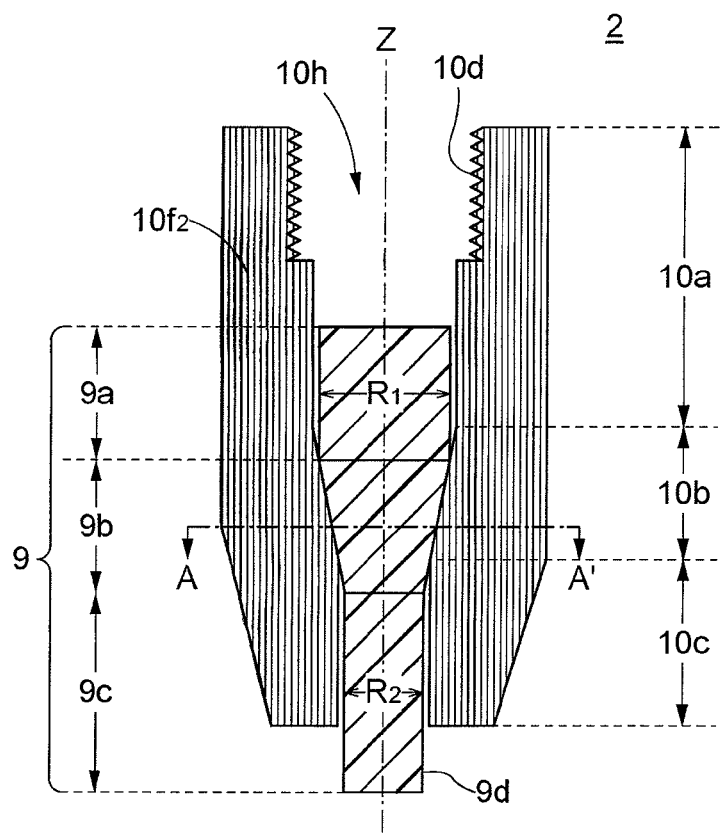
Figure 2B:
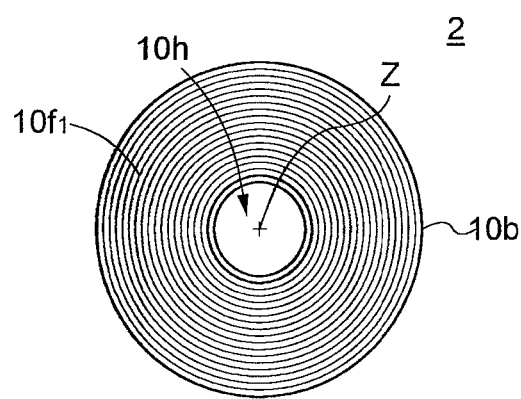

FIGS. 2A and 2B are views each illustrating a structure of a seed crystal holder for pulling-up a single crystal according to a second embodiment of the present invention. FIG. 2A is a vertical cross-sectional view, and FIG. 2B is a horizontal cross-sectional view taken along line A-AT of FIG. 2A.

As illustrated in FIGS. 2A and 2B, a seed crystal holder 2 is featured in that it is formed using a carbon fiber cloth including a fiber component parallel to the center axis Z. That is, the carbon fiber cloth has both a fiber component $10f_1$ in the circumferential direction intersecting the axial direction and a fiber component $10f_2$ parallel to the axial direction. Other configurations are the same as those in the first embodiment.

The seed crystal holder 2 according to the present embodiment can be formed using the sheet winding method. More specifically, in this method, a molded product is obtained by winding a carbon fiber cloth impregnated with resin or the like around a die such that the direction of the fiber component included in the carbon fiber cloth is parallel to the axial direction. According to the present embodiment, the carbon fiber cloth includes the fiber component $10f_1$ in the circumferential direction intersecting the axial direction, so that it is possible to prevent stress concentration from the seed crystal holder 2 to the seed crystal 9 as in the first embodiment. In addition, according to the present embodiment, the carbon fiber cloth includes the fiber component $10f_2$ parallel to the axial direction, so that it is possible to enhance tensile strength of the seed crystal holder 2 in the axial direction.

Figure 3A:
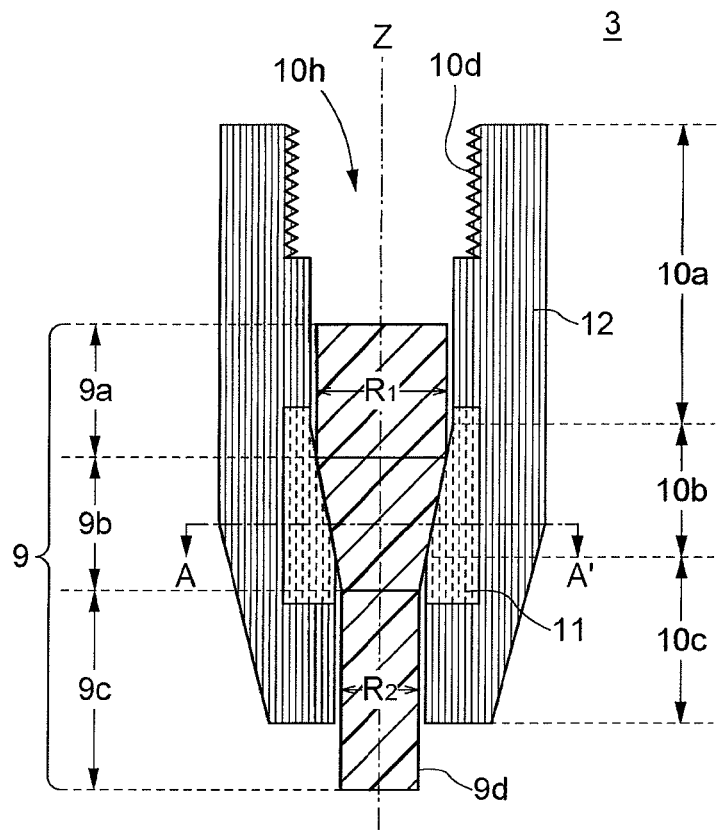
Figure 3B:
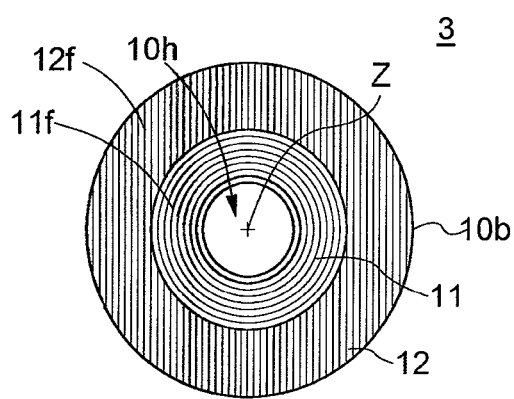

FIGS. 3A and 3B are views each illustrating a structure of a seed crystal holder for pulling-up a single crystal according to a third embodiment of the present invention. FIG. 3A is a vertical cross-sectional view, and FIG. 3B is a horizontal cross-sectional view taken along line A-A' of FIG. 3A.

As illustrated in FIGS. 3A and 3B, a seed crystal holder 3 is featured in that only a part of the seed crystal holder 3 that contacts the outer peripheral surface of the tapered section 9b of the seed crystal 9 has an isotropic fiber structure, while the remaining part has an anisotropic fiber structure. That is, the seed crystal holder 3 according to the present embodiment includes a combination of a core part 11 having an isotropic fiber structure and a clad part 12 having an anisotropic fiber structure, and the core part 11 is mainly provided in the inner peripheral side region of the cylindrical intermediate section 10b. Carbon fibers 11f of the core part 11 is oriented in the circumferential direction in the horizontal cross section perpendicular to the center axis Z and has isotropy as viewed from the center axis Z. On the other hand, carbon fibers 12f of the clad part 12 is aligned straight in one direction in the horizontal cross section and has anisotropy as viewed from the center axis Z. Other configurations are the same as those in the first embodiment.

The core part 11 only needs to be provided at least in the inner peripheral side region of the cylindrical intermediate section 10b so as to contact the seed crystal 9 and may extend up to the cylindrical upper section 10a or cylindrical lower section 10c. Thus, as illustrated, a configuration may be adopted, in which apart of the core part 11 extends up to the cylindrical upper section 10a or cylindrical lower section 10c. Further, the core part 11 may extend in the entire radial direction of the cylindrical intermediate section 10b from the inner peripheral side region of the cylindrical intermediate section 10b to the outer peripheral side region thereof.

In the present embodiment, the core part 11 is integrally molded with the clad part 12. The clad part 12 is made of carbon fiber cloth, in which planar carbon fiber cloth is multilayered. The plane of the carbon fiber cloth is parallel to the center axis Z and is oriented in a specific direction in a horizontal cross section. The carbon fiber cloth preferably has not only the fiber component intersecting the center axis Z, but also the fiber component parallel to the center axis Z. This makes it possible to enhance the tensile strength of the entire holder in the axial direction.

In the present embodiment, the thread groove 10d for screwing the pulling-up shaft is provided on the clad part 12 side. When the thread groove 10d is formed in the clad part 12 having an anisotropic fabric structure, the strength of the thread groove 10d can be further enhanced.

The core part 11 can be molded by the filament winding method (FW method) or sheet winding method (SW method). Further, the clad part 12 can be molded by, e.g., a hand lay-up molding method. In the hand lay-up molding method, a carbon fiber cloth molded using a shaping mold is impregnated with resin or the like and laminated to a predetermined thickness while being subjected to deforming using a brush or roller, whereby a molded product is obtained. Then, the molded product of the clad part 12 and molded product of the core part 11 are carbonized together, whereby both molded products can be integrated. Thereafter, the carbonized, integrated molded product is shaped, followed by finishing such as polishing, whereby the seed crystal holder 3 is completed.

In the seed crystal holder 3 according to the present embodiment, the fiber structure at apart contacting the seed crystal 9 has isotropy, so that it is possible to prevent stress concentration from the seed crystal holder 3 to the seed crystal 9, thereby making it possible to prevent breakage of the seed crystal 9. Further, the fiber structure of the clad part 12 has anisotropy and has a fiber component parallel to the center axis Z, so that it is possible to enhance tensile strength in the axial direction and thus to improve mechanical strength of the seed crystal holder.

Figure 4A:
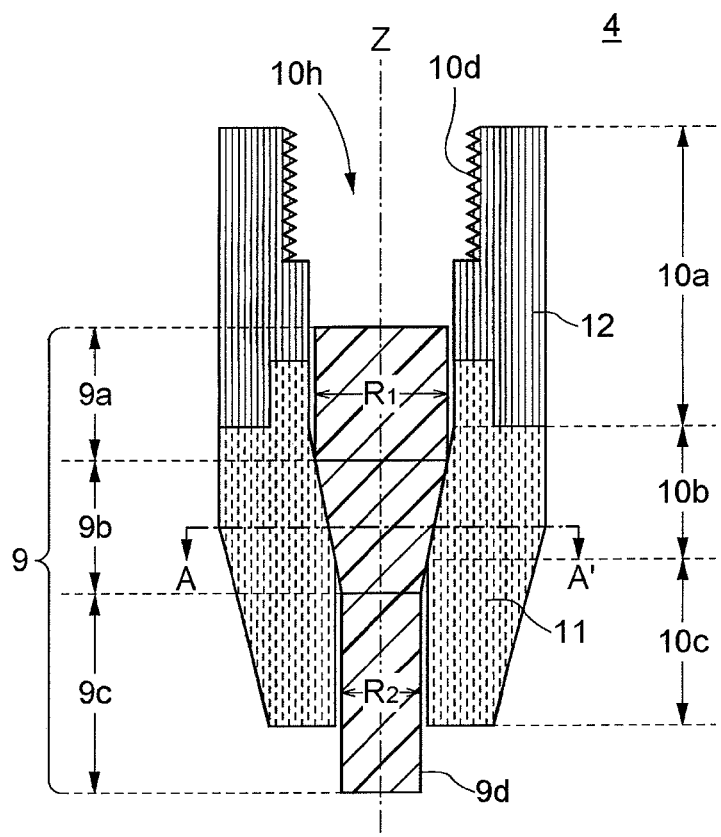
Figure 4B:
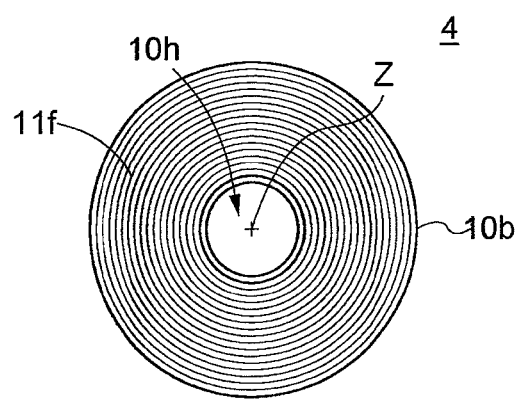

FIGS. 4A and 4B are views each illustrating a structure of a seed crystal holder for pulling-up a single crystal according to a fourth embodiment of the present invention. FIG. 4A is a vertical cross-sectional view, and FIG. 4B is a horizontal cross-sectional view taken along line A-A' of FIG. 4A.

As illustrated in FIGS. 4A and 4B, a seed crystal holder 4 is featured in that the lower half thereof is formed as the core part 11 and the upper half thereof as the clad part 12. That is, the core part 11 is mainly provided in the cylindrical intermediate section 10b and the cylindrical lower section 10c, and the clad part 12 is provided in the cylindrical upper section 10a. A part of the core part 11 extends up to the cylindrical upper section 10a, and the boundary surface between the core part 11 and clad part 12 in the vertical direction is formed in a concavo-convex surface, so that vertical connection strength between the core part 11 and the clad part 12 can be enhanced. Other configurations are the same as those of the third embodiment.

In the seed crystal holder 4 according to the present embodiment as well, the fiber structure of the core part 11 constituting the contact surface with the seed crystal 9 has isotropy, so that it is possible to prevent stress concentration from the seed crystal holder 4 to the seed crystal 9, thereby making it possible to prevent breakage of the seed crystal 9. Further, the fiber structure of the clad part 12 has anisotropy and has a fiber component parallel to the center axis Z, so that it is possible to enhance tensile strength in the axial direction and thus to improve mechanical strength of the seed crystal holder. Further, according to the present embodiment, the separately molded core part 11 and clad part 12 can be integrated with each other through carbonization or can mechanically be connected using a pin or a bolt. This facilitates the manufacture of the seed crystal holder 4 and can lead to a reduction in manufacturing cost and improvement in processing accuracy.

Figure 5A:
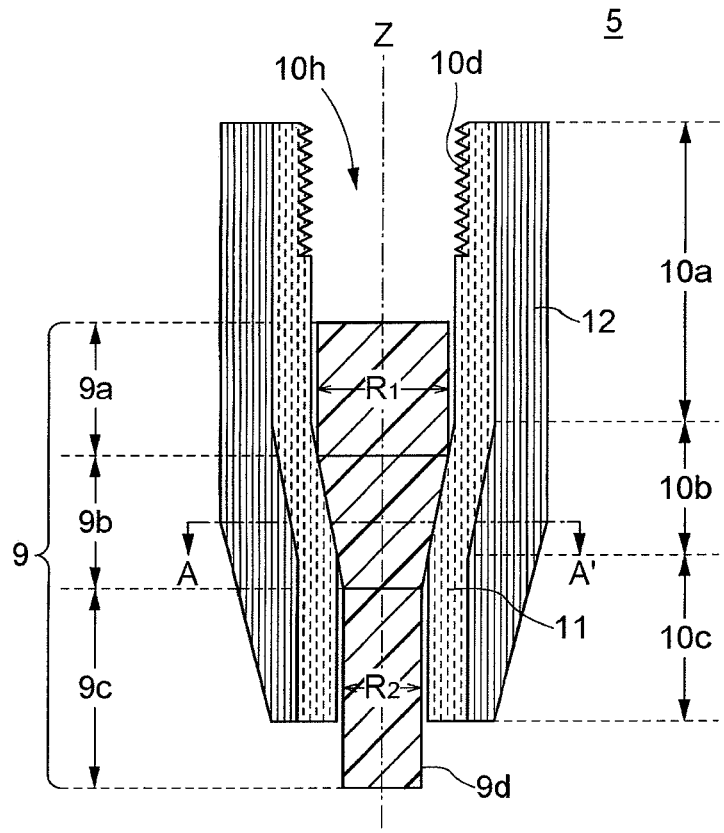
Figure 5B:
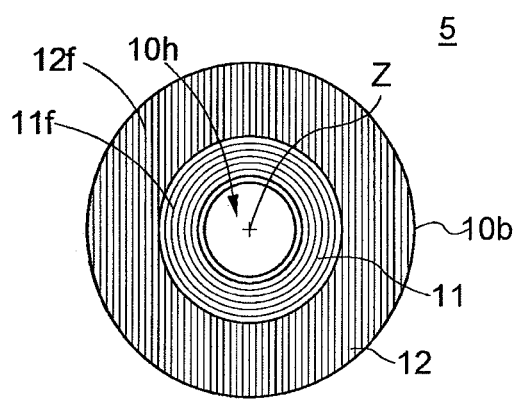

FIGS. 5A and 5B are views each illustrating a structure of a seed crystal holder for pulling-up a single crystal according to a fifth embodiment of the present invention. FIG. 5A is a vertical cross-sectional view, and FIG. 5B is a horizontal cross-sectional view taken along line A-A' of FIG. 5A.

As illustrated in FIGS. 5A and 5B, a seed crystal holder 5 is featured in that the inner peripheral side regions of the respective cylindrical upper section 10a, cylindrical intermediate section 10b, and cylindrical lower section 10c are formed as the core part 11 and outer peripheral sides thereof as the clad part 12. The entire inner peripheral surface of the hollow space 10h of the seed crystal holder 5 is formed as the core part 11 and, accordingly, the thread groove 10d for screwing the pulling-up shaft is provided on the core part 11 side. Other configurations are the same as those of the third embodiment.

In the seed crystal holder 5 according to the present embodiment as well, the fiber structure of the core part 11 constituting the contact surface with the seed crystal 9 has isotropy, so that it is possible to prevent stress concentration from the seed crystal holder 5 to the seed crystal 9, thereby making it possible to prevent breakage of the seed crystal 9. Further, the fiber structure of the clad part 12 has anisotropy and has a fiber component parallel to the center axis Z, so that it is possible to enhance tensile strength in the axial direction and thus to improve the mechanical strength of the seed crystal holder. Further, the seed crystal holder 5 according to the present embodiment is easier to process than the seed crystal holder 3 according to the third embodiment, thereby making it possible to achieve a reduction in manufacturing cost and improvement in processing accuracy.

Figure 6A:
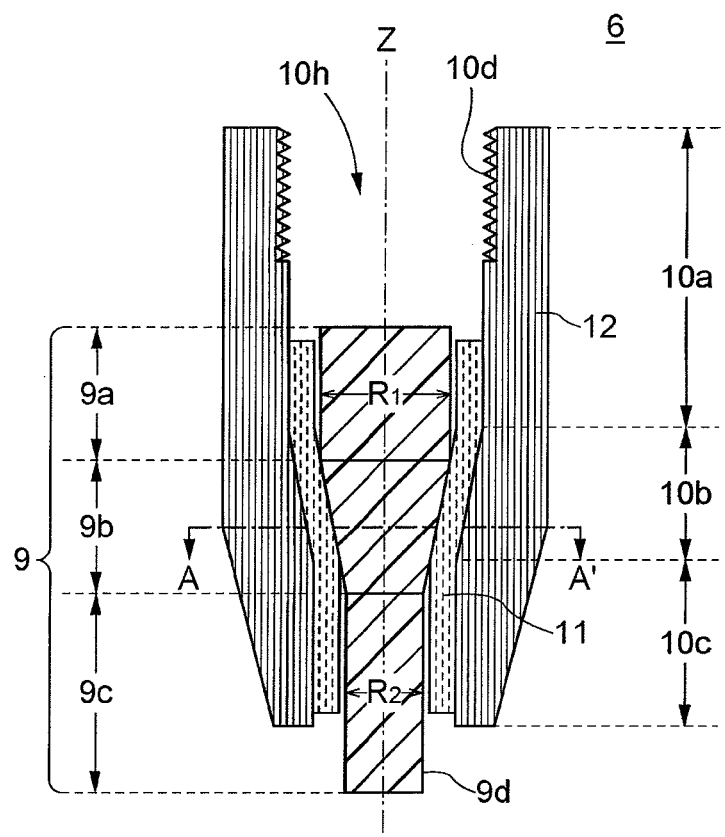
Figure 6B:
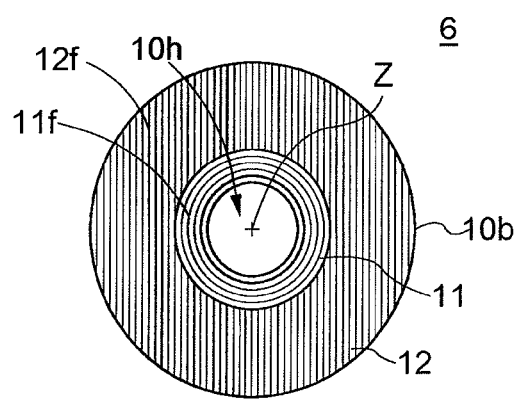

FIGS. 6A and 6B are views each illustrating a structure of a seed crystal holder for pulling-up a single crystal according to a sixth embodiment of the present invention. FIG. 6A is a vertical cross-sectional view, and FIG. 6B is a horizontal cross-sectional view taken along line A-A' of FIG. 6A.

As illustrated in FIGS. 6A and 6B, a seed crystal holder 6 is featured in that the core part 11 and clad part 12 are formed as separate members and that it has a socket structure where the core part 11 is housed in the cylindrical clad part 12. As in the third embodiment, the core part 11 contacting the outer peripheral surface of the tapered section 9b of the seed crystal 9 has an isotropic fiber structure, and the clad part 12 positioned outside of the core part 11 has an anisotropic fiber structure.

The core part 11 is removable from the clad part 12. The outer peripheral surface of the core part 11 is formed into a tapered surface, and this tapered surface is brought into surface contact with the tapered inner peripheral surface of the clad part 12, whereby the core part 11 is fixed in the clad part 12. The core part 11 may be set in the clad part 12 after the seed crystal 9 is set in the clad part 12 or before the setting of the seed crystal 9.

According to the present embodiment, in addition to the effects obtained by the third embodiment, another effect is obtained. Specifically, a manufacturing process is made very simple since the core part 11 and clad part 12 can be separately manufactured. Further, the core part 11 and clad part 12 can be separately replaced with new ones, thereby achieving a reduction in component cost.

Figure 7A:
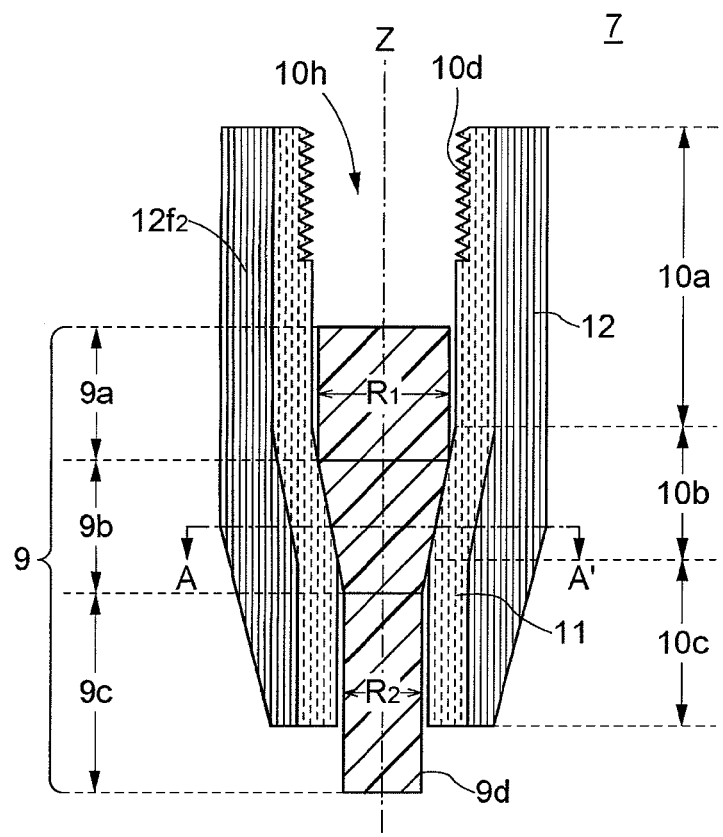
Figure 7B:
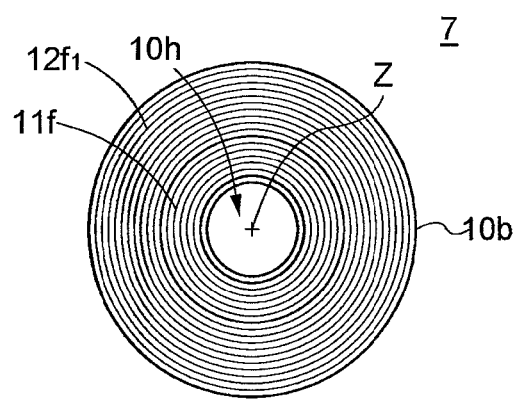

FIGS. 7A and 7B are views each illustrating a structure of a seed crystal holder for pulling-up a single crystal according to a seventh embodiment of the present invention. FIG. 7A is a vertical cross-sectional view, and FIG. 7B is a horizontal cross-sectional view taken along line A-A' of FIG. 7A.

As illustrated in FIGS. 7A and 7B, a seed crystal holder 7 is featured in that the inner peripheral side regions of the respective cylindrical upper section 10a, cylindrical intermediate section 10b, and cylindrical lower section 10c are formed as the core part 11 and outer peripheral sides thereof as the clad part 12 and that the core part 11 has an isotropic fiber structure molded using the filament winding method (FW method), while the clad part 12 has an isotropic fiber structure molded using the sheet winding method (SW method). In particular, a carbon fiber cloth is used to form the clad part 12. The carbon fiber cloth has both a fiber component $12f_1$ in the circumferential direction intersecting the axial direction and a fiber component $12f_2$ parallel to the axial direction. The entire inner peripheral surface of the hollow space 10h of the seed crystal holder 7 is formed as the core part 11 and, accordingly, the thread groove 10d for screwing the pulling-up shaft is provided on the core part 11 side.

The seed crystal holder 7 according to the present embodiment can be formed by combining the filament winding method (FW method) and sheet winding method (SW method). That is, first, a molded product of the core part 11 is prepared by the filament winding method, and then a carbon fiber cloth impregnated with resin or the like is wound outside the molded product of the core part 11 to form the clad part 12. At this time, it is necessary to wind the carbon fiber cloth in such a way that the orientation direction of the fiber component $12f_2$ included in the carbon fiber cloth is parallel to the axial direction. Then, the obtained molded product is heated at high temperatures in an inert gas atmosphere until it is carbonized (graphitized). Thereafter, the carbonized molded product is shaped, followed by finishing such as polishing, whereby the seed crystal holder 7 is completed.

In the seed crystal holder 7 according to the present embodiment, not only the fiber structure of the core part 11 constituting the contact surface with the seed crystal 9, but also the fiber structure of the clad part 12 has an isotropy, so that it is possible to prevent stress concentration from the seed crystal holder 7 to the seed crystal 9, thereby making it possible to prevent breakage of the seed crystal 9. Further, the carbon fiber cloth constituting the clad part 12 has a fiber component $12f_2$ parallel to the center axis Z, so that it is possible to enhance tensile strength in the axial direction and thus to improve mechanical strength of the seed crystal holder. Further, the seed crystal holder 7 according to the present embodiment is easier in processing than the seed crystal holder 5 according to the fifth embodiment, thereby making it possible to achieve a reduction in manufacturing cost and improvement in processing accuracy.

Next, a method of manufacturing a silicon single crystal by the CZ method using the above-described seed crystal holder will be described.

Figure 8:
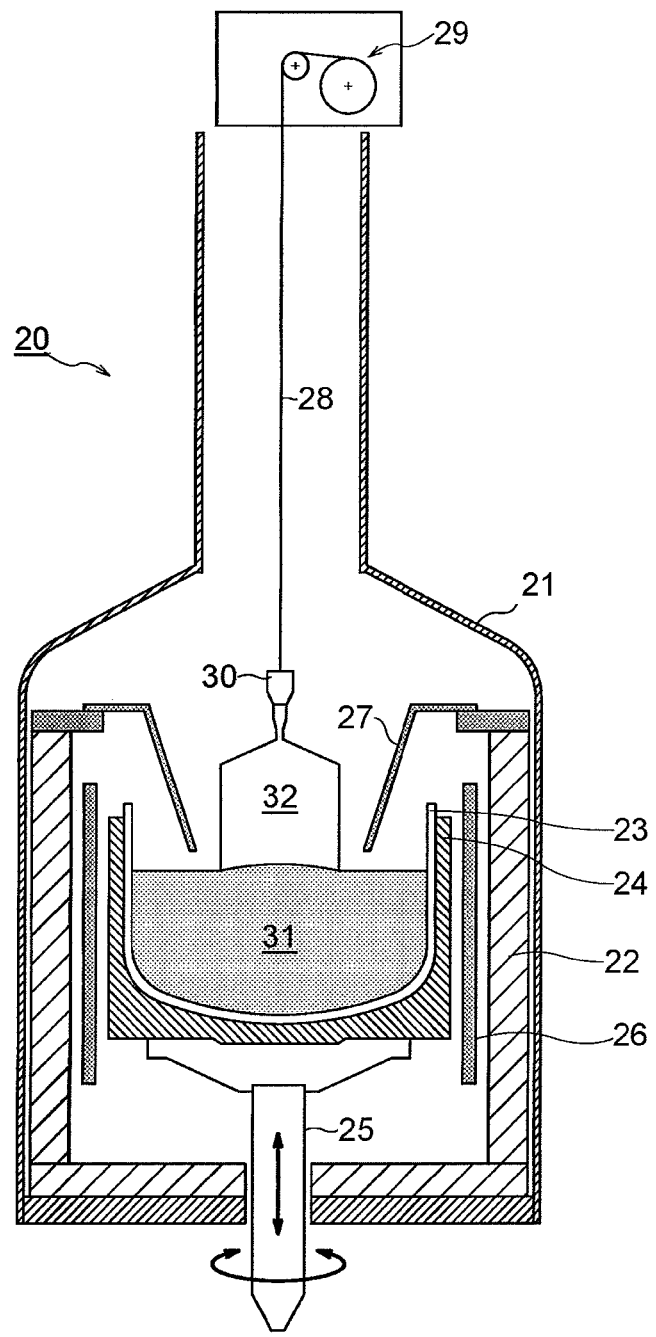
FIG. 8 is a cross-sectional view illustrating an example of the structure of a silicon single crystal pulling-up apparatus and FIG. 9 is a schematic horizontal cross-sectional view illustrating a structure of a conventional seed crystal holder for pulling-up single crystal.

FIG. 8 is a cross-sectional view illustrating an example of the structure of a silicon single crystal pulling-up apparatus.

As illustrated in FIG. 8, a silicon single crystal pulling-up apparatus 20 includes a chamber 21, a heat insulating material 22 disposed inside the chamber 21, a quartz crucible 23 installed in the chamber 21, a susceptor 24 supporting the quartz crucible 23, a rotation support shaft 25 vertically movably supporting the susceptor 24, a heater 26 disposed so as to surround the susceptor 24, a substantially inverted truncated cone-shaped thermal shield 27 disposed above the quartz crucible 23, a single crystal pulling-up wire 28 (pulling-up shaft) disposed above the quartz crucible 23 and coaxially with the rotation support shaft 25, and a wire winding mechanism 29 disposed above the chamber 21.

The wire 28 extends straight downward from the wire winding mechanism 29 disposed above the chamber 21 up to near the quartz crucible 23. The distal end portion of the wire 28 is attached with a seed crystal holder 30, and the seed crystal holder 30 holds the seed crystal. As the seed crystal holder 30, any of the above seed crystal holders 1 to 7 according to the respective first to seventh embodiments can be used.

First, in the pulling-up process of the silicon single crystal, the quartz crucible 23 is set inside the susceptor 24, polycrystalline silicon raw material is filled in the quartz crucible 23, and a seed crystal is set in the seed crystal holder 30. Then, the silicon raw material is heated by the heater 26 to generate a silicon melt 31, and the seed crystal is lowered to contact the silicon melt 31. Thereafter, the seed crystal is slowly pulled up while rotating the seed crystal and quartz crucible 23 to thereby grow a substantially columnar-shaped silicon single crystal 32. FIG. 1 illustrates a state where the silicon single crystal 32 during growing is suspended to the wire 28 through the seed crystal holder 30.

The diameter of the silicon single crystal 32 is controlled by controlling the pulling-up speed and the power of the heater 26. In the growing process of the silicon single crystal 32, a neck section in which the crystal diameter is narrowed is formed, and then the crystal diameter is gradually increased to form a shoulder section. Then, a pulling-up condition is changed when the diameter reaches a prescribed value (e.g., equal to or more than 450 mm) to form a body section having a constant diameter. Further, at the end of the pulling-up, the diameter is narrowed to form a tail section, and, finally, the silicon single crystal 32 is separated from the liquid surface. Thus, a silicon single crystal ingot is completed.

While preferred embodiments of the present invention have been explained above, the present invention is not limited thereto. Various modifications can be made to the embodiments without departing from the scope of the present invention and it is needless to say that such modifications are also embraced within the scope of the invention.

For example, in the above embodiments, the seed crystal holder has been described as a seed crystal holder for pulling up the silicon single crystal; however, the seed crystal holder according to the present invention is not limited to this, and may be used for pulling up various single crystals. Further, in the above embodiments, although the angle of the tapered surface of the hollow space 10h of the seed crystal holder is made equal to the angle of the tapered surface of the seed crystal 9, it may be made larger than the angle of the tapered surface of the seed crystal 9. Further, the above embodiments can be arbitrarily combined as necessary.

REFERENCE SIGNS LIST

- 1-8 seed crystal holder
- 8f carbon fibers
- 9 seed crystal
- 9a upper section
- 9b tapered section
- 9c lower section
- 10a cylindrical upper section
- 10b cylindrical intermediate section
- 10c cylindrical lower section
- 10d thread groove
- 10f carbon fibers
- 10f$_1$ fiber component in the circumferential direction
- 10f$_2$ fiber component parallel to the axial direction
- 10h hollow space
- 11 core part
- 11f carbon fibers
- 12 clad part
- 12f carbon fibers
- 12f$_1$ fiber component in the circumferential direction
- 12f$_2$ fiber component parallel to the axial direction
- 20 silicon single crystal pulling-up apparatus
- 21 chamber
- 22 heat insulating material
- 23 quartz crucible
- 24 susceptor
- 25 rotation support shaft
- 26 heater
- 27 thermal shield
- 28 single crystal pulling-up wire
- 29 wire winding mechanism
- 20 seed crystal holder
- 31 silicon melt
- 32 silicon single crystal

What is claimed is:

1. A method of manufacturing a silicon single crystal by Czochralski (CZ) method, comprising:
    setting a seed crystal to a seed crystal holder;
    lowering the seed crystal holder to dip the seed crystal into a silicon melt; and
    pulling up the seed crystal with the seed crystal holder to grow the silicon single crystal,
    wherein the seed crystal holder is made of a carbon fiber-reinforced carbon composite material and has a substantially cylindrical shape with a hollow space having a shape matching an outer shape of a substantially rod-shaped seed crystal,
    wherein the seed crystal holder includes:
        a core part in which a direction of carbon fibers has isotropy as viewed from a center axis of the hollow space; and
        a clad part in which the direction of the carbon fibers has anisotropy as viewed from the center axis of the hollow space,
    wherein the core part is provided at least at a part contacting an outer peripheral surface of the seed crystal and in inner peripheral side regions of respective cylindrical intermediate section and cylindrical lower section, and
    wherein the clad part is provided in a cylindrical upper section, the cylindrical intermediate section positioned below the cylindrical upper section, and the cylindrical lower section.

2. The method of manufacturing the silicon single crystal as claimed in claim 1, wherein the direction of the carbon fibers constituting the core part has a circumferential direction.

3. The method of manufacturing the silicon single crystal as claimed in claim 2, wherein the direction of the carbon fibers constituting the core part is parallel to the center axis.

4. The method of manufacturing the silicon single crystal as claimed in claim 1, wherein
    the cylindrical upper section has a first hole diameter,
    the cylindrical intermediate section is gradually reduced in diameter from the first hole diameter to a second hole diameter, and
    the cylindrical lower section has the second hole diameter.

5. The method of manufacturing a silicon single crystal as claimed in claim 4,
    wherein the core part is provided in the cylindrical intermediate section and the cylindrical lower section, and
    wherein the clad part is provided in the cylindrical upper section.

6. The method of manufacturing a silicon single crystal as claimed in claim 4,
    wherein the core part is provided in the inner peripheral side regions of the respective cylindrical upper section, cylindrical intermediate section, and cylindrical lower section, and
    wherein the clad part is provided in the outer peripheral side regions of the respective cylindrical upper section, cylindrical intermediate section, and cylindrical lower section.

7. The method of manufacturing a silicon single crystal as claimed in claim 1, wherein the core part is removable from the clad part.

8. The method of manufacturing a silicon single crystal as claimed in claim 1, wherein the seed crystal has a tapered section having a gradually reduced diameter, wherein the hollow space has an inner peripheral surface brought into surface contact with the tapered section, and wherein the direction of the carbon fibers at a part constituting the inner peripheral surface has isotropy as viewed from the center axis of the hollow space.

9. The method of manufacturing a silicon single crystal as claimed in claim 1, wherein the core part is provided only in the inner peripheral side region of the cylindrical intermediate section and the cylindrical lower section.

10. The method of manufacturing a silicon single crystal as claimed in claim 1, wherein the core part is mainly provided in the inner peripheral side region of the cylindrical intermediate section.

11. The method of manufacturing a silicon single crystal as claimed in claim 1, wherein the core part is provided only in the inner peripheral side region of the cylindrical intermediate section.

* * * * *